United States Patent [19]

Seebinger

[11] 4,454,927

[45] Jun. 19, 1984

[54] REENTRANT CONE DRIVEN LOUDSPEAKER

[75] Inventor: Frederick L. Seebinger, Kinnelon, N.J.

[73] Assignee: Atlas Sound Division of American Trading and Production Corp., Parsippany, N.J.

[21] Appl. No.: 332,789

[22] Filed: Dec. 21, 1981

[51] Int. Cl.³ .............................................. H05K 5/00

[52] U.S. Cl. .................................... 181/152; 181/150; 181/155; 181/172; 181/199

[58] Field of Search ............... 181/141, 144, 148, 199, 181/175, 150, 172, 156, 152, 159, 155, 191, 192

[56] References Cited

U.S. PATENT DOCUMENTS

| | | | |
|---|---|---|---|
| 3,642,091 | 2/1972 | Nohara et al. | 181/152 X |
| 3,909,530 | 9/1975 | Gossmiller | 181/159 X |
| 3,938,617 | 2/1976 | Forbes | 181/155 |
| 3,938,618 | 2/1976 | Ambruoso, Jr. | 181/155 |

*Primary Examiner*—Benjamin R. Fuller

*Attorney, Agent, or Firm*—Blum, Kaplan, Friedman, Silberman and Beran

[57] ABSTRACT

A miniaturized cone driven reentrant loudspeaker is provided. A cone speaker is positioned within a housing. The housing includes a front wall for radiating sound and a side wall. The cone speaker is directed towards a reflector back plate having a generally spherical surface which protrudes into the cone speaker for directing sound waves towards sidewalls of the housing to define a miniaturized cone driven reentrant loudspeaker.

10 Claims, 6 Drawing Figures

REENTRANT CONE DRIVEN LOUDSPEAKER

BACKGROUND OF THE INVENTION

This invention is directed to a miniaturized reentrant cone driven loudspeaker and in particular to a miniaturized reentrant cone loudspeaker for use in life safety systems, audible warning signalling and emergency signalling.

Heretofore, miniaturized compression driven folded horn loudspeakers for use in life safety systems, for auidble warning signalling and for emergency signalling have been developed. One such compression driven folded horn loudspeaker is disclosed in U.S. Pat. No. 4,116,302, which patent is assigned to the same assignee as the instant invention. These types of compression driven folded horn loudspeakers are preferred for use in outdoor applications where extreme and direct weather conditions must be considered.

However, in indoor and indirect weathering conditions, cone driven loudspeakers are often utilized as a less expensive alternative to compression driven folded horn loudspeakers. Nevertheless, among the disadvantages that have been encountered with miniaturized cone driven loudspeakers has been their unreliability to indirect weather conditions, vandalism, and their inability to approach the level of performance of compression driven folded horn loudspeakers. Accordingly, a miniaturized cone driven loudspeaker that is easy to manufacture, less vulnerable to weather conditions and vandalism, and admits of improved performance is provided.

SUMMARY OF THE INVENTION

Generally speaking, in accordance with the instant invention, a miniaturized reentrant cone driven loudspeaker in a generally cubically shaped housing is provided. The housing is constructed for facile assembly of a front wall and sidewall which is urged together with a reflector back plate. A cone speaker is disposed in the housing in facing relationship with the reflector back plate so that the reflector back plate and housing define a folded reentrant cone driven loudspeaker that approaches the performance level of a compression driven folded horn.

A further feature of the invention is in the suspension of the cone speaker assembly between the housing and the reflector back plate. A resilient grommet is secured around the circular periphery of the cone speaker. The housing and back plate are brought together to grip the grommet, and thereby fully support the speaker. Screws are used to draw the reflector back plate to the housing, thereby providing simplicity of structure and simplicity of construction.

Accordingly, it is an object of the instant invention to provide an improved cone driven loudspeaker.

Another object of the instant invention is to provide an improved miniaturized reentrant cone driven loudspeaker.

A further object of the instant invention is to provide a miniaturized reentrant cone driven loudspeaker for use in life safety systems for providing audible warning signals and for emergency signalling.

A further object of the instant invention is to provide a miniaturized, simple to manufacture, reentrant cone driven loudspeaker.

Still a further object of the instant invention is to provide a reentrant cone loudspeaker that can be disposed in a four-inch electrical box installation.

Still a further object of the instant invention is to provide a miniaturized cone driven loudspeaker that is less vulnerable to weathering and vandalism.

And still another object of the instant invention is to provide a miniaturized cone driven loudspeaker that utilizes a combination of a housing and reflector back plate to improve the performance thereof.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENT

Figure 6:
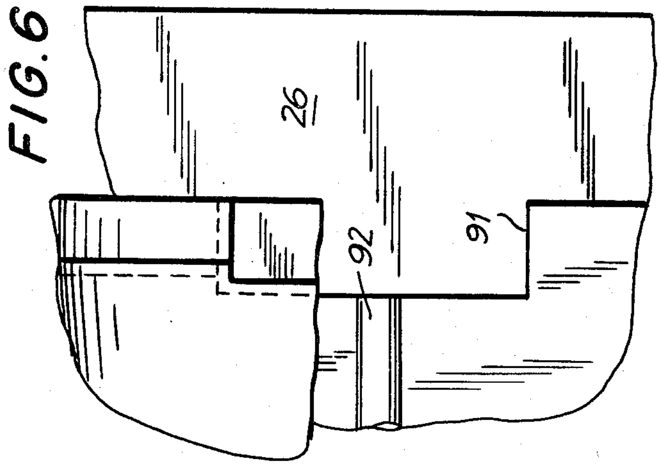
FIG. 6 is a fragmentary sectional view taken generally along lines 6—6 of FIG. 3 with parts omitted for clarity.
Figure 1:
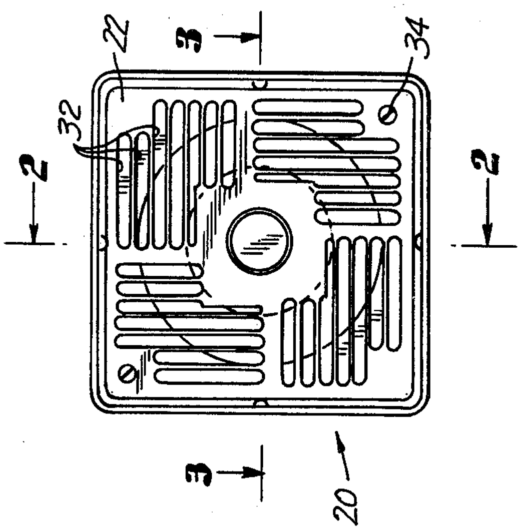
FIG. 1 is a front elevation view of the loudspeaker of the invention.
Figure 5:
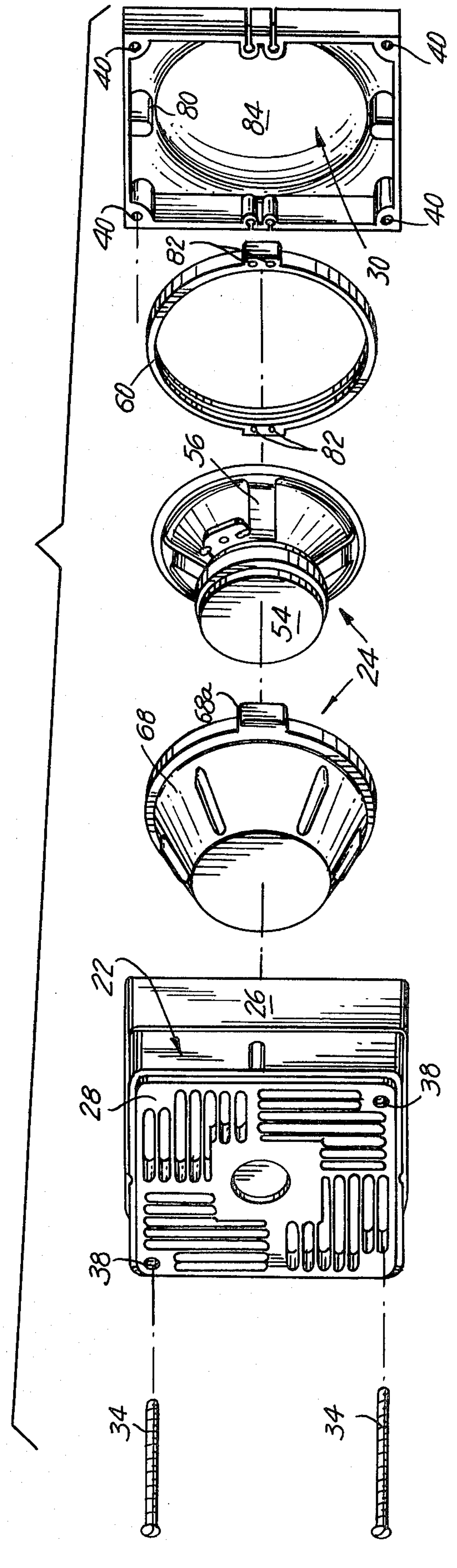
FIG. 5 is an exploded view of the loudspeaker illustrated in FIGS. 1 through 4.

Referring now to the Figures a cone driven loudspeaker generally indicated as 20 comprises a housing generally indicated as 22 having a wall-mounted cone driven speaker generally indicated as 24, contained therein and a reflector back plate, generally indicated as 30. The overall dimensions of speaker assembly 24 approximate the interior dimensions of the housing 22 providing space for sound chambers and/or passageways for the propagation of sound. In accordance with the invention, the interior space between the speaker assembly 24 and the housing 22 is utilized in providing a reentrant characteristic to the speaker assembly 24 and also in defining a folded horn configuration between the speaker assembly 24 and the interior of the housing 22. The foregoing characteristics are obtained by directing the speaker assembly 24 towards the reflector back plate and away from the front of the housing from where the sound radiates from the loudspeaker in a manner that will be discussed in greater detail below.

Housing 22 comprises sidewalls 26, a front wall 28 integrally formed with sidewalls 26. The front wall 28 is perforated, the perforations 32 providing communication between the interior and exterior of the housing 22 so that sound can radiate from the front wall 28. The area of the perforations 32 includes a major portion of the area of the front wall 28 for maximum radiation of the sound power. As explained below, no acoustic loading need be provided by the grill of the front wall 28 since the acoustic loading of the speaker 24 is accomplished by the folded horn. As is illustrated in the broken away section of FIG. 2, blind openings 36a are formed in sidewalls 26 for receiving screws 36 to secure the reflector back plate 30 to the housing.

Specifically, screws 36 pass through openings 40 in the reflector back plate to blind opening 36a in respective corners of the housing. Two further screws 34 pass through the housing from respective corners of the front wall 28 to corresponding corners of reflector back plate 30 for securing the reflector back plate and housing to a 4" electrical box or other suitable mounting. Screws 34 pass through guides 38 located alongside the intersections of the sidewalls 26, the guides 38 directing the screws 34 toward bores 40 in the back plate 30 to which the screws 34 pass for engagement with the 4" electrical box.

Figure 4:
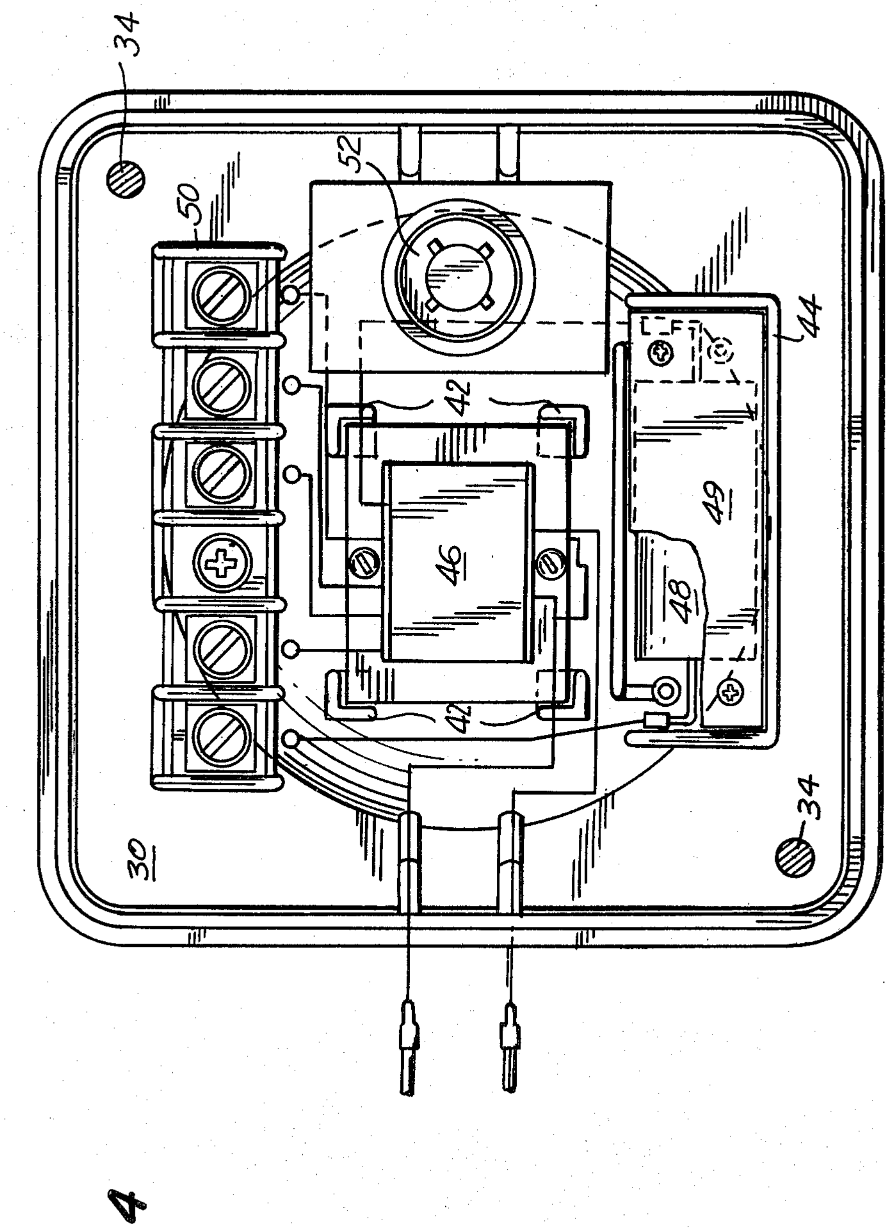
FIG. 4 is a rear elevational view of the back plate of the invention.

The outer surface (FIG. 4) of the reflector back plate 30 is adapted for carrying conventional electrical circuit elements used in the operation of the speaker 24. By way of example, plate 30 includes cradles 42 and 44 for supporting, respectively, a transformer 46 and a filter condenser 48 as is shown in phantom in the drawing, and which are connected in a well-known manner to the terminal strip 55 of the speaker 24. A plate 49 is used to secure the condenser 48 against the back plate to mechanically secure the condenser. Also, plate 30 includes a terminal support 50 and a strain relief 52 whereby electric wires can be connected to the terminal strip 55 of speaker 20 by either connection to the terminal strip or through the strain relief.

Figure 2:
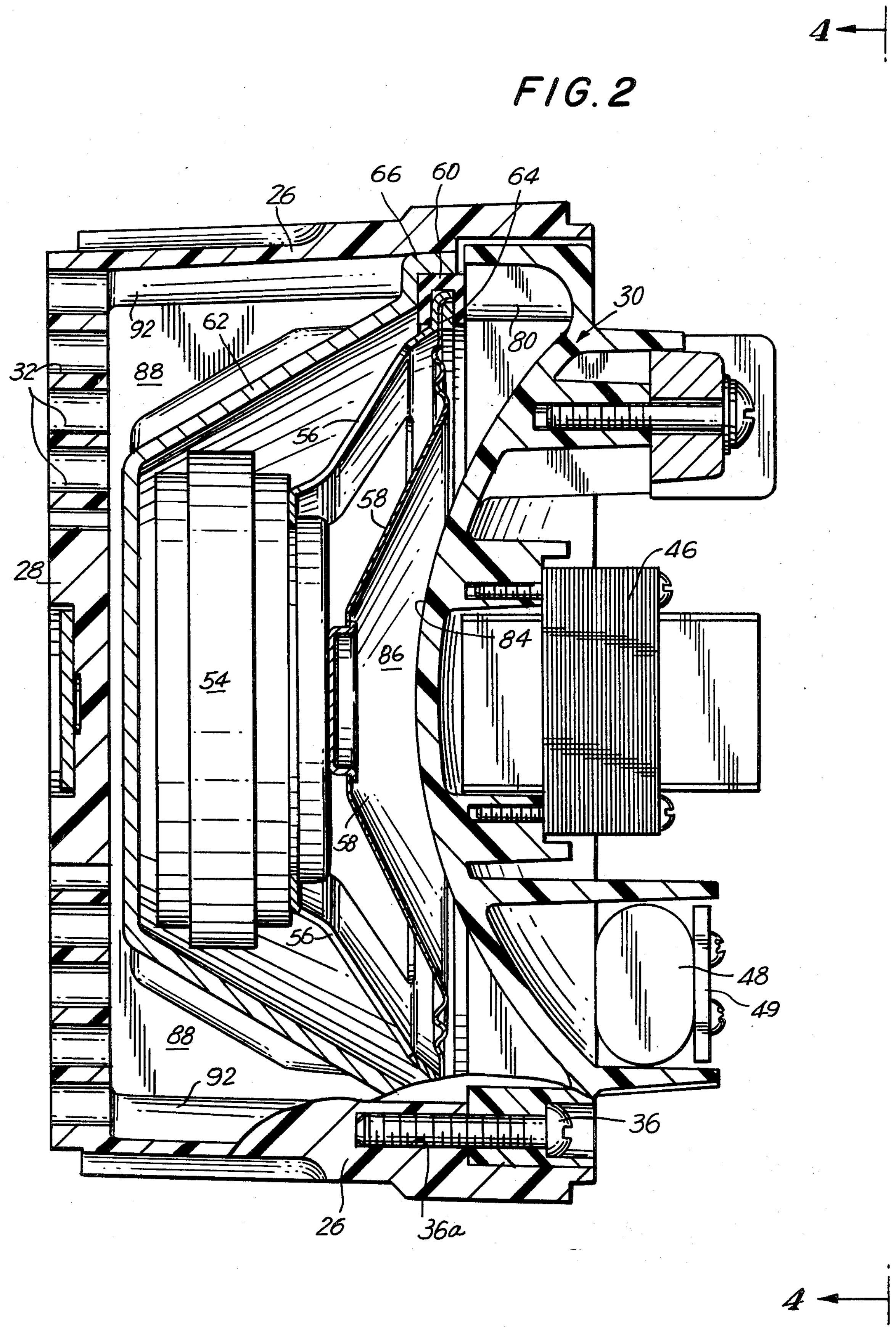
FIG. 2 is a sectional view taken along line 2—2 in FIG. 1.
Figure 3:
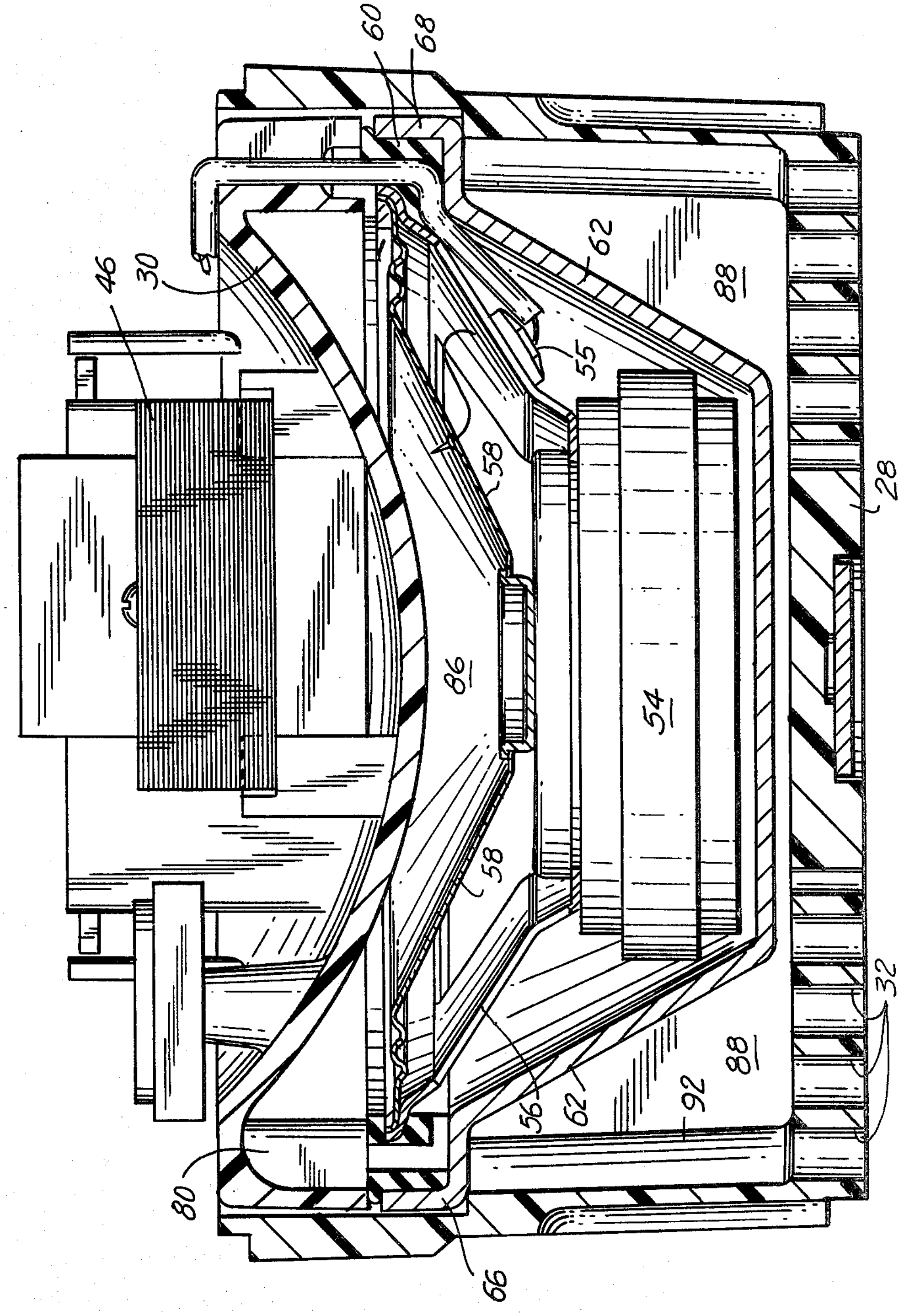
FIG. 3 is a sectional view taken along lines 3—3 of FIG. 1.

As illustrated in FIGS. 2 and 3, cone driven speaker assembly 24 includes the coil assembly 54 having a frame 56 extending therefrom, a cone 58 supported by the frame 56, a grommet 60 secured about the circular rim of the frame 56, and an enclosure cap 62 in contact with the outer surface of the grommet 60. The enclosure cap 62 is fabricated out of a plastic, and encloses the coil assembly 54 and the outer surface of the cone 58 to provide an interior volume which serves to tune the speaker assembly 24 by back loading the speaker. The use of an enclosure cap to provide a sound chamber behind the cone of a speaker is a well-known acoustic practice for tuning and protecting the speaker assembly.

The grommet 60 includes a U-shaped channel 64 which mates with the periphery of the frame 56. The enclosure cap 62 includes a rim 66 having a shelf 68 for mating with the exterior surface of the grommet 60 so that the rim 66 of the enclosure cap 62 retains the grommet 60 in position on the frame 56. The grommet 60 is made of a resilient material, such as rubber, so as to permit emplacement of the grommet 60 upon the frame 56 and in contact with the rim 66. The resiliency of the grommet 60 permits the grommet 60 to serve as a vibration absorber which permits vibratory movement of the frame 56 an the cone 58 independently of any vibratory movement of the housing sidewall 26. Such isolation improves the fidelity of sound radiated by the loudspeaker 24. The cone 58 connects with the frame 56 only at the outer rim of the frame 56, the central portion of the cone 58 connecting with a plug of magnetic material positioned within a coil (not shown) of the coil assembly 54. Pulsation in the electric current applied to the coil produces corresponding pulsations in the strength of a resulting magnetic field which induces the vibrations in the cone 58 in a well known manner.

In accordance with a feature of the invention, the enclosure cap 62 is supported within the housing 22 along the circular periphery 68 thereof. Circular periphery 68 includes diametrically opposite ears 68a that are received within recesses 91 formed in the inner surface of side walls 26 (FIG. 6). The circular periphery 68 is supported by ribs 92 located on the sidewalls 26. Upon displacing enclosure cap 62, within the unitary structure of the sidewalls 26 and the front wall 28 of the housing, the outer surface of the ears 68a rests against ribs 92. Upon emplacement of the reflector back plate 30 against the rear edges of the sidewalls 26, the pedestals 80 of the back plate, contact the rear surface of the grommet 60. Upon a tightening of the screws 36 into blind openings 36a in the sidewalls of the housing back plate 30 is drawn toward the front wall 28 causing the ribs 92 and the pedestals 80 to close upon the rim 56 and the grommet 60. Thereby, the speaker assembly 24 is supported only along the periphery of the frame 56. Portions of the speaker assembly 24 are free to vibrate without contacting the housing 22. And, as noted hereinabove, vibrations that may be present at the rim of the cone 58 and the rin of the frame 56 are acoustically isolated from the sidewalls 26 by the resiliency of the grommet 60.

The grommet 60 also contains lead guides 82 through which electric leads pass in order to make connection between the electrical element on the outside surface of the back plate 30 and the coil assembly 54. The electric leads pass from the guides 82 along the interior surface of the enclosure 62 to contact terminals of the coil assembly 54.

As illustrated in FIG. 2, surface 84 of the reflective back plate 30 is convex, being substantially spherical so as to protrude into the cone 58. The convex surface 84, along with the interior surface of the cone 58, provide a space 86 which directs sound from the cone 58 towards the rim of the cone 58, and towards the junction of the reflective back plate 30 with the sidewalls 26. The close spacing between the convex surface 84 and the cone 58, serves as a conduit for the sound in the manner of a flared horn.

A spacing between the exterior surface of the enclosure cap 62 and the interior surfaces of the sidewalls 26 provides a passage 88 whereby sound propagates from the space 86 to the perforations 32 for radiation from the front wall 28. Due to the conical shape of the enclosure cap 62, the cross section of the passage 88 becomes increasingly large with distance from the rear of the housing 22. The passage 88 has a form similar to that of a horn and provides an acoustic impedance transformation between the space 86 and the front wall 28.

Accordingly, the coupling together of the space 86 with the passage 88 results in the formation of a reentrant horn that can produce the desired broad banding of the loudspeaker 20 to accommodate the bandwidth of voice communication, audible signalling. The impedance matching insures efficient acoustic coupling of power from the speaker assembly 24 through the perforations 32 of the front wall 28 to provide an adequately loud alarm signal and clear crisp voice communication. Additionally, the folded horn depicted in the drawings permits all of the foregoing advantages to be accomplished within the relatively small space between the speaker 24 and the housing 22 which is only fractionally larger than the speaker 24.

Thus, the instant invention is particularly characterized by the use of a reflector back plate and rear facing cone speaker assembly to provide a reentrant cone driven loudspeaker. By facing the cone speaker assembly towards the reflector back plate several specific advantages are obtained. By utilizing a unitary construction comprised of the housing, enclosure cap and reflector back plate a uniformity of performance is maintained in each loudspeaker manufactured in accordance with the instant invention in contrast to forward directed cone driven speakers that have heretofore been available.

Also, other advantages of the instant invention include the cone speaker is protected from indirect weathering conditions and is less susceptible to vandalism; and the back plate is used, not only as a sound reflective member, but also is used as a mounting plate for the peripheral components of the loudspeaker, such as the transformer, strain relief, etc.

Moreover, with respect to the folded reentrant horn created by the housing walls and reflector back plate, improved coupling and direction of the sound with increased efficiency an acoustic coupling is obtained. Specifically, improved band width control over the acoustic range is obtained, thereby improving speech and signalling transient response and, hence, the inteligibility of the sound produced. To this end, the reentrant horn defined by the rear facing cone speaker assembly and reflector back plate affects improved transient response and reduced distortion in a miniaturized loudspeaker that can be disposed in a four inch electrical box installation.

Finally, the exemplary embodiment of the instant invention illustrated in the drawings depicts a housing formed of a four inch electrical box. However, the housing of the instant invention can also be defined by a flange mounted housing for providing flush mounted loudspeakers in a wall or ceiling and would provide the same benefits described above with respect to the instant invention.

It will thus be seen that the objects set forth above, and those made apparent from the preceding description, are efficiently attained and, since certain changes may be made in the above construction without departing from the spirit and scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A miniaturized reentrant cone driven folded horn loudspeaker comprising a housing having a front wall, a side wall and a reflector plate for the radiation of sound, and a cone driven speaker means positioned within said housing and facing away from the front wall and toward said reflector back plate so that said reflector back plate, side wall and front wall radiate sound, and define a folded horn, and a resilient mounting means, said resilient mounting means surrounding the periphery of said cone speaker, said resilient mounting means being sandwiched between said housing and said reflector back plate to thereby secure and suspend said cone driven speaker means in said housing.

2. A miniaturized reentrant cone driven loudspeaker, as claimed in claim 1, wherein said cone driven speaker means includes an enclosure cap and cone speaker, said enclosure cap being disposed between said cone speaker and a side wall of said housing, said enclosure cap and said housing side wall forming a horn-shaped passage for conduction of sound from the reflector back plate of said housing to the front wall of said housing.

3. A miniaturized reentrant cone driven loudspeaker, as claimed in claim 2, wherein said reflector back plate is convexly shaped and configured to cooperate with said cone speaker for connecting said cone speaker with the rear of said horn-shaped passage to define a reentrant horn.

4. A miniaturized reentrant cone driven loudspeaker, as claimed in claim 3, wherein said front wall is perforated to permit the passage of sound therethrough.

5. A reentrant cone driven loudspeaker comprising a cone speaker means having an enclosing wall and a radiating aperture; a housing having dimensions fractionally larger than the overall dimensions of said speaker means, and a reflector back plate, said speaker means being enclosed by said housing, and said back plate, said housing having a radiating aperture disposed in the opposite direction of said radiating aperture of said cone speaker means; and including resilient suspension means for suspending said speaker means between said housing and said reflector back plate for supporting said cone speaker means within said housing; wherein the space between the housing and the enclosing wall is in the form of a folded horn.

6. A reentrant cone driven loudspeaker, as claimed in claim 5, wherein the radiating aperture of said housing is a perforated wall, and wherein the radiating aperture of said cone speakers means is a circular region of a cone of said speaker.

7. A reentrant cone driven loudspeaker, as claimed in claim 5, wherein reflective back plate and said housing are secured together by at least two screws.

8. A reentrant cone driven loudspeaker, as claimed in claim 7, further comprising means extending from interior surfaces of said housing for engaging said speaker means, said engaging means being urged together for gripping said speaker means by said screws concurrently with the urging together of said housing and said reflective back plate.

9. A reentrant cone driven loudspeaker, as claimed in claim 7, or 8 wherein said housing is substantially the same dimension as a four-inch electrical box.

10. A reentrant cone driven loudspeaker, as claimed in claim 5, wherein said housing includes side walls, said resilient suspension means being a resilient grommet, said cone speaker means including a circular rim, said side walls and said reflective back plate coming together to grip said circular rim and said grommet to thereby resiliently support said speaker means.

* * * * *